(12) United States Patent
Takamine

(10) Patent No.: US 11,012,052 B2
(45) Date of Patent: May 18, 2021

(54) SURFACE ACOUSTIC WAVE FILTER

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 15/260,429

(22) Filed: Sep. 9, 2016

(65) Prior Publication Data

US 2016/0380616 A1 Dec. 29, 2016

Related U.S. Application Data

(63) Continuation of application No. PCT/JP2015/056372, filed on Mar. 4, 2015.

(30) Foreign Application Priority Data

Mar. 31, 2014 (JP) .............................. JP2014-071088

(51) Int. Cl.
*H03H 9/64* (2006.01)
*H03H 9/145* (2006.01)
(Continued)

(52) U.S. Cl.
CPC .......... *H03H 9/64* (2013.01); *H03H 9/02535* (2013.01); *H03H 9/02574* (2013.01);
(Continued)

(58) Field of Classification Search
CPC ...... H03H 9/64; H03H 9/145; H03H 9/14544; H03H 9/14576
(Continued)

(56) References Cited

U.S. PATENT DOCUMENTS 5,773,911 A * 6/1998 Tanaka ............... H03H 9/02543
310/313 A
5,835,990 A * 11/1998 Saw ..................... H03H 9/0038
310/313 D
(Continued)

FOREIGN PATENT DOCUMENTS

JP 05-267990 A 10/1993
JP 09-238047 A 9/1997
(Continued)

OTHER PUBLICATIONS

English translation of Official Communication issued in corresponding International Application PCT/JP2015/056372, dated May 19, 2015.

*Primary Examiner* — Dean O Takaoka
(74) *Attorney, Agent, or Firm* — Keating & Bennett, LLP

(57) ABSTRACT

A longitudinally coupled resonator type surface acoustic wave filter includes a high-acoustic-velocity member, a low-acoustic-velocity film provided on the high-acoustic-velocity member, a piezoelectric film provided on the low-acoustic-velocity film, a plurality of interdigital transducers provided on the piezoelectric film and along a propagation direction of a surface acoustic wave and each including a plurality of electrode fingers, and reflectors arranged such that the interdigital transducers are interposed therebetween from both sides in the propagation direction of the surface acoustic wave. An electrode finger pitch is uniform or substantially uniform in each of the interdigital transducers. When a wavelength determined by the electrode finger pitch in the reflector is defined as λ, an inter-electrode finger center distance that is an interval between each of the interdigital transducers and the interdigital transducer adjacent thereto is not shorter than about 0.25λ and not longer than about 0.37λ.

18 Claims, 5 Drawing Sheets

(51) Int. Cl.
*H03H 9/02* (2006.01)
*H03H 9/72* (2006.01)

(52) U.S. Cl.
CPC ........ *H03H 9/02637* (2013.01); *H03H 9/145* (2013.01); *H03H 9/14538* (2013.01); *H03H 9/6436* (2013.01); *H03H 9/725* (2013.01)

(58) Field of Classification Search
USPC .................................................. 333/193, 195
See application file for complete search history.

(56) References Cited

U.S. PATENT DOCUMENTS

| | | | | |
|---|---|---|---|---|
| 5,874,868 | A * | 2/1999 | Shimoe | H03H 9/6436 310/313 B |
| 6,583,691 | B2 * | 6/2003 | Takamine | H03H 9/14582 310/313 D |
| 6,731,188 | B2 * | 5/2004 | Sawada | H03H 9/0071 333/133 |
| 6,762,657 | B2 * | 7/2004 | Takamine | H03H 9/0042 310/313 B |
| 6,781,282 | B1 * | 8/2004 | Ikeura | H03H 9/0033 310/313 B |
| 6,815,868 | B2 * | 11/2004 | Shibata | H03H 9/0038 310/313 C |
| 6,972,643 | B2 * | 12/2005 | Tsunekawa | H03H 9/0028 310/313 D |
| 7,411,473 | B2 * | 8/2008 | Kando | H03H 9/0222 310/313 B |
| 7,872,548 | B2 * | 1/2011 | Nishihara | H03H 9/725 333/133 |
| 2002/0017969 | A1 * | 2/2002 | Takamine | H03H 9/0042 333/193 |
| 2013/0285768 | A1 * | 10/2013 | Watanabe | H03H 9/0222 333/193 |
| 2013/0335169 | A1 * | 12/2013 | Godshalk | H03H 9/02055 333/187 |
| 2014/0225684 | A1 * | 8/2014 | Kando | H03H 9/02559 333/195 |
| 2015/0028720 | A1 | 1/2015 | Kando | |
| 2015/0102705 | A1 | 4/2015 | Iwamoto et al. | |

FOREIGN PATENT DOCUMENTS

| | | |
|---|---|---|
| JP | 2001-196896 A | 7/2001 |
| JP | 2002-009588 A | 1/2002 |
| JP | 2002-290196 A | 10/2002 |
| JP | 2002290196 A * | 10/2002 |
| JP | 2003-298384 A | 10/2003 |
| WO | 2012/086639 A1 | 6/2012 |
| WO | 2013/141168 A1 | 9/2013 |
| WO | 2013/191122 A1 | 12/2013 |

* cited by examiner

SURFACE ACOUSTIC WAVE FILTER

CROSS REFERENCE TO RELATED APPLICATIONS

This application claims the benefit of priority to Japanese Patent Application 2014-071088 filed Mar. 31, 2014 and is a Continuation application of PCT/JP2015/056372 filed on Mar. 4, 2015, and the entire contents of each application are hereby incorporated herein by reference.

BACKGROUND OF THE INVENTION

1. Field of the Invention

The present invention relates to a longitudinally coupled resonator type surface acoustic wave filter.

2. Description of the Related Art

Hitherto, a longitudinally coupled resonator type surface acoustic wave filter is widely used as a band pass filter for use in a cellular phone or the like.

In the longitudinally coupled resonator type surface acoustic wave filter disclosed in Japanese Unexamined Patent Application Publication No. 2002-009588, a narrow-pitch portion having a small electrode finger pitch is provided at a portion at which a first interdigital transducer and a second interdigital transducer are adjacent to each other. Thus, insertion loss is reduced.

The elastic wave device disclosed in International Publication No. 2012/086639 has a multilayer body in which a high-acoustic-velocity film, a low-acoustic-velocity film, and a piezoelectric film are laminated. Thus, leakage of energy of a surface acoustic wave is reduced.

However, when a narrow-pitch portion as in Japanese Unexamined Patent Application Publication No. 2002-009588 is provided in the elastic wave device disclosed in International Publication No. 2012/086639, a spurious response sometimes occurs in a frequency region at approximately 1.1 times of a high-frequency-side end portion of a pass band.

SUMMARY OF THE INVENTION

Preferred embodiments of the present invention provide a surface acoustic wave filter that includes a multilayer body including a high-acoustic-velocity member, a low-acoustic-velocity film, and a high-acoustic-velocity member and is able to prevent occurrence of a spurious response.

A surface acoustic wave filter according to a preferred embodiment of the present invention is a longitudinally coupled resonator type surface acoustic wave filter including a high-acoustic-velocity member; a low-acoustic-velocity film provided on the high-acoustic-velocity member; a piezoelectric film provided on the low-acoustic-velocity film; a plurality of interdigital transducers provided on the piezoelectric film and along a propagation direction of a surface acoustic wave and each including a plurality of electrode fingers; and reflectors arranged such that the interdigital transducers are interposed therebetween from both sides in the propagation direction of the surface acoustic wave. A propagation velocity of a bulk wave in the high-acoustic-velocity member is higher than a propagation velocity of the bulk wave in the piezoelectric film. A propagation velocity of the bulk wave in the low-acoustic-velocity film is lower than the propagation velocity of the bulk wave in the piezoelectric film. An electrode finger pitch is uniform or substantially uniform in each of the interdigital transducers. When a wavelength determined by the electrode finger pitch in the reflector is defined as $\lambda$, an inter-electrode finger center distance that is an interval between each of the interdigital transducers and the interdigital transducer adjacent thereto is not shorter than about $0.25\lambda$ and not longer than about $0.37\lambda$.

In a specific aspect of the surface acoustic wave filter according to a preferred embodiment of the present invention, the high-acoustic-velocity member includes a high-acoustic-velocity film. A support substrate is provided on a surface of the high-acoustic-velocity film that is opposite to a surface of the high-acoustic-velocity film on which the low-acoustic-velocity film is provided.

In another specific aspect of a surface acoustic wave filter according to a preferred embodiment of the present invention, the high-acoustic-velocity member includes a high-acoustic-velocity substrate.

According to various preferred embodiments of the present invention, it is possible to provide a surface acoustic wave filter that includes a multilayer body including a high-acoustic-velocity member, a low-acoustic-velocity film, and a piezoelectric film and is able to prevent occurrence of spurious.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention. It should be noted that each preferred embodiments described in the present specification are merely illustrative and not limiting, and configurations shown in different preferred embodiments may be partially substituted or combined.

Figure 1:
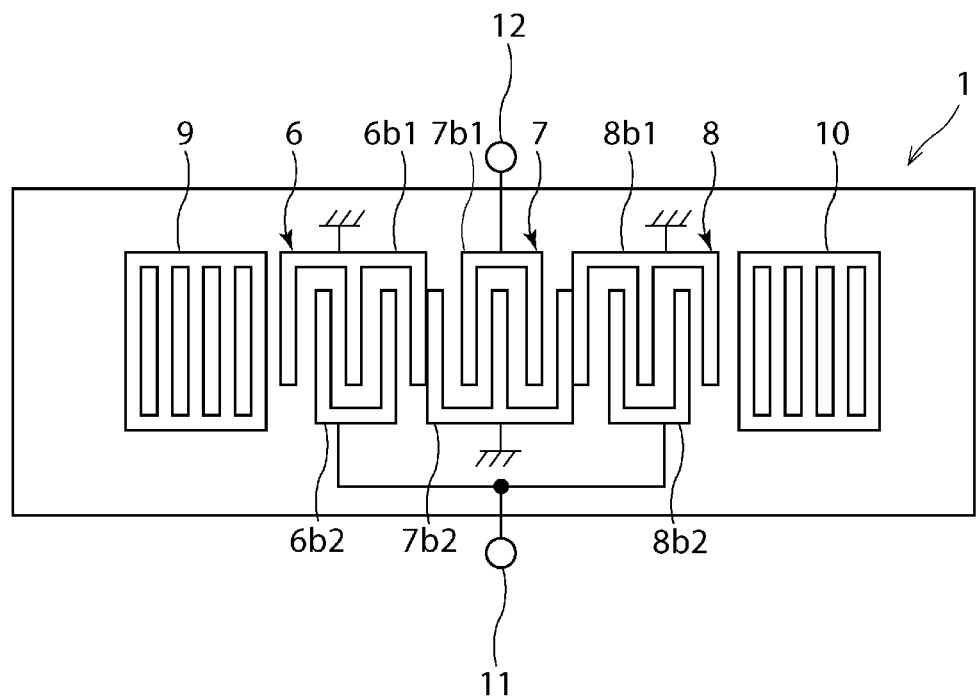
FIG. 1 is a plan view of a surface acoustic wave filter according to a first preferred embodiment of the present invention.
Figure 2:
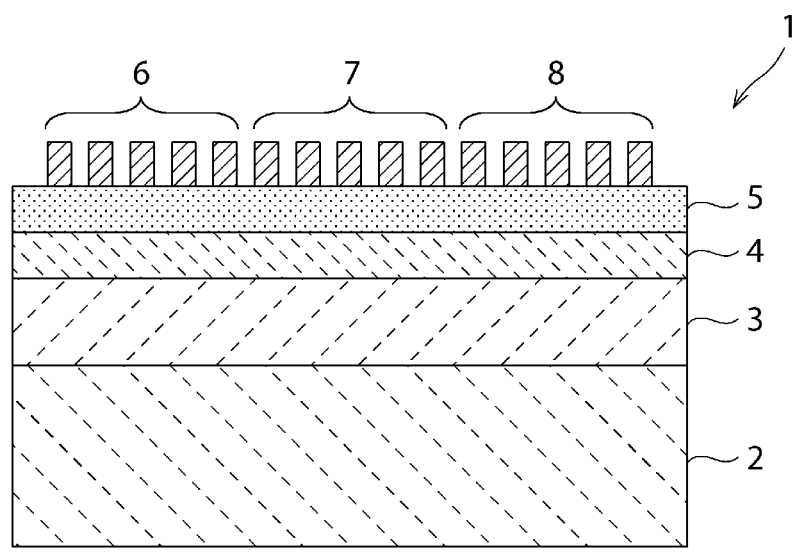
FIG. 2 is a front cross-sectional view of the surface acoustic wave filter according to the first preferred embodiment of the present invention.

FIG. 1 is a plan view of a surface acoustic wave filter according to a first preferred embodiment of the present invention. FIG. 2 is a front cross-sectional view of the surface acoustic wave filter according to the first preferred embodiment of the present invention.

The surface acoustic wave filter 1 includes a support substrate 2. In the present preferred embodiment, the support substrate 2 preferably is formed from Si and has a thickness of about 200 μm, for example. The support substrate 2 may be formed from an appropriate material other than Si. In addition, the thickness of the support substrate 2 is not particularly limited to the above-described value.

A high-acoustic-velocity member 3 is provided on the support substrate 2. The propagation velocity of a bulk wave in the high-acoustic-velocity member 3 is higher than the propagation velocity of a bulk wave in a later-described piezoelectric film 5. In the present preferred embodiment, the high-acoustic-velocity member 3 preferably includes a high-acoustic-velocity film formed of an aluminum nitride film and has a thickness of about 1345 nm, for example. The high-acoustic-velocity member 3 may be formed from an appropriate high-acoustic-velocity ceramic material other than aluminum nitride, such as silicon nitride. In addition, the thickness of the high-acoustic-velocity member 3 is not particularly limited to the above-described value.

A low-acoustic-velocity film 4 is provided on the high-acoustic-velocity member 3. The propagation velocity of a bulk wave in the low-acoustic-velocity film 4 is lower than the propagation velocity of a bulk wave in the later-described piezoelectric film 5. In the present preferred embodiment, the low-acoustic-velocity film 4 preferably is formed from silicon oxide and has a thickness of about 670 nm, for example. The low-acoustic-velocity film 4 may be formed from an appropriate ceramic material other than silicon oxide. In addition, the thickness of the low-acoustic-velocity film 4 is not particularly limited to the above-described value.

The piezoelectric film 5 is provided on the low-acoustic-velocity film 4. In the present preferred embodiment, the piezoelectric film 5 preferably is formed from LiTaO$_3$ having a cut angle of about 55° and has a thickness of about 600 nm, for example. The piezoelectric film 5 may be formed from an appropriate piezoelectric single crystal other than LiTaO$_3$ having a cut angle of about 55°, for example. In addition, the thickness of the piezoelectric film 5 is not particularly limited to the above-described value.

Three interdigital transducers 6 to 8 and reflectors 9 and 10 are provided on the piezoelectric film 5. Thus, a three-IDT longitudinally coupled resonator type filter is provided. The interdigital transducers 6 to 8 are arranged in order along a propagation direction of a surface acoustic wave. In addition, the reflectors 9 and 10 are arranged such that a portion in which the interdigital transducers 6 to 8 are provided is interposed therebetween from both sides in the propagation direction of the surface acoustic wave.

A busbar 6b2 of the interdigital transducer 6 and a busbar 8b2 of the interdigital transducer 8 are electrically connected to a hot-side terminal 11. A busbar 7b1 of the interdigital transducer 7 is electrically connected to a hot-side terminal 12. A busbar 6b1, a busbar 7b2, and a busbar 8b1 are connected to a ground potential.

In the present preferred embodiment, each of the interdigital transducers 6 to 8 includes a multilayer metallic film. That is, Al containing about 1 wt % of Cu is laminated on Ti having a thickness of about 12 nm such that a thickness thereof is about 162 nm, for example. Each of the interdigital transducers 6 to 8 may include a multilayer body formed from another metal, or may include a single metallic film. The thickness of each of the interdigital transducers 6 to 8 is not limited to the above-described value. In addition, interdigital transducers of which the number is a plural number other than three may be provided.

A protective film is laminated on the interdigital transducers 6 to 8. In the present preferred embodiment, the protective film preferably is formed from silicon oxide and has a thickness of about 25 nm, for example. The protective film may be formed from an appropriate material such as silicon nitride. In addition, the thickness of the protective film is not limited to the above-described value. Moreover, the protective film may not be provided.

Figure 3:
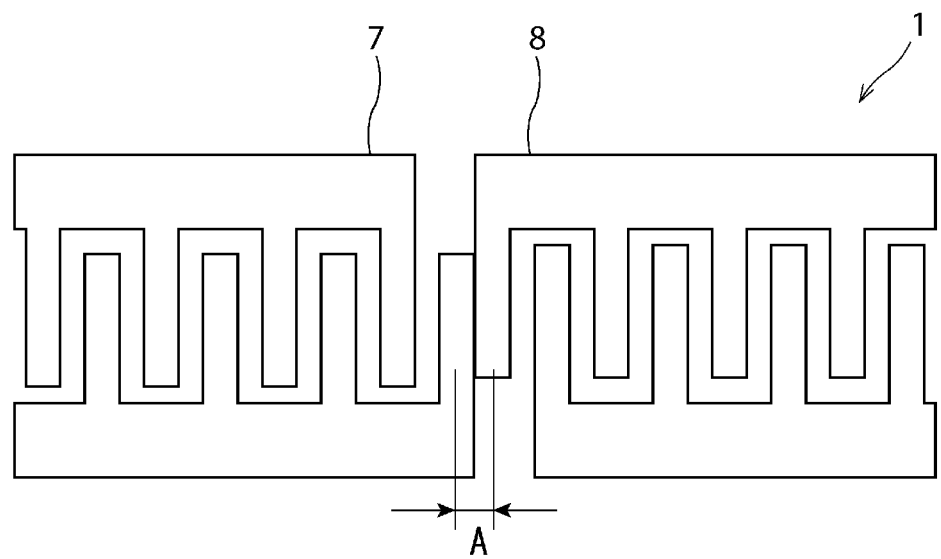
FIG. 3 is a schematic plan view showing a portion at which interdigital transducers are adjacent to each other in the surface acoustic wave filter according to the first preferred embodiment of the present invention.

FIG. 3 is a schematic plan view showing a portion at which the interdigital transducer are adjacent to each other in the surface acoustic wave filter according to the first preferred embodiment of the present invention.

As shown in FIGS. 1 and 3, electrode finger pitches of the interdigital transducers 6 to 8 preferably are uniform or substantially uniform. That is, a narrow pitch portion is not provided. When the wavelength of the surface acoustic wave determined by the electrode finger pitch in the reflectors 9 and 10 is defined as λ, the present preferred embodiment preferably has an inter-electrode finger center distance A that is the interval between the adjacent interdigital transducers is not shorter than about 0.25λ and not longer than about 0.37λ, for example. With the above configuration, in the present preferred embodiment, it is possible to reduce occurrence of spurious. In addition, it is possible to ensure a required pass band width. The reason for this will be described below.

Figure 4:
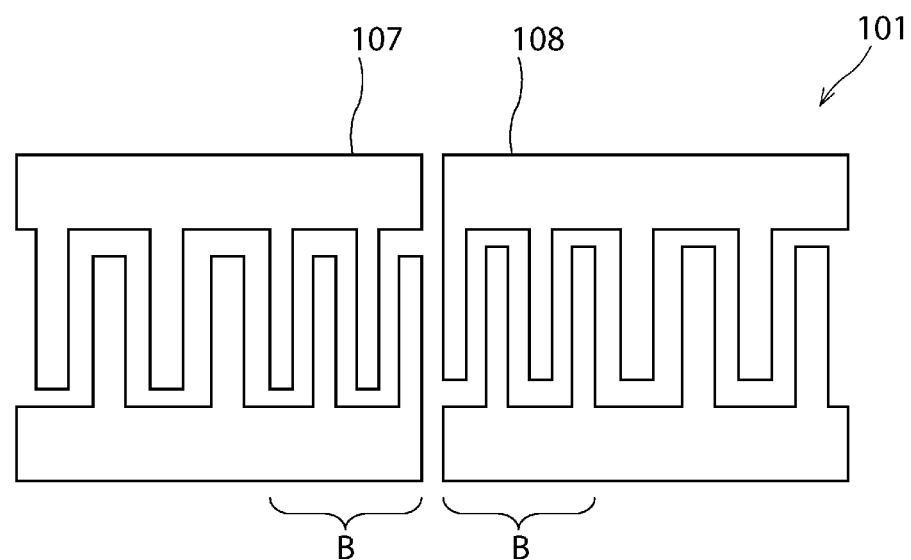
FIG. 4 is a schematic plan view showing a portion at which interdigital transducers are adjacent to each other in an existing surface acoustic wave filter.

FIG. 4 is a schematic plan view showing a portion at which interdigital transducers are adjacent to each other in an existing surface acoustic wave filter.

In the surface acoustic wave filter 101, each of interdigital transducers 107 and 108 has a narrow pitch portion B. The wavelength determined by the electrode finger pitch in the narrow pitch portion B is shorter than the wavelength determined by the electrode finger pitch in the other portion. Therefore, a response of a surface acoustic wave excited in the narrow pitch portion B appears at the high-frequency side with respect to the pass band. The response is normally very small.

However, in a structure in which a high-acoustic-velocity member, a low-acoustic-velocity film, and a piezoelectric film are laminated, the energy of a bulk wave is hard to leak. Thus, a response of a surface acoustic wave excited by the narrow pitch portion B becomes great, causing spurious.

On the other hand, the electrode finger pitches of the interdigital transducers 6 to 8 of the surface acoustic wave filter 1 of the present preferred embodiment are uniform or substantially uniform, and no narrow pitch portion B is provided. Thus, spurious caused due to a narrow pitch portion B does not occur. In addition, in the preferred embodiment of the present invention, the surface acoustic wave filter 1 includes a multilayer body including the support substrate 2, the high-acoustic-velocity member 3, the low-acoustic-velocity film 4, and the piezoelectric film 5, and the inter-electrode finger center distance A is set to be not shorter than about 0.25λ and not longer than about 0.37λ. Thus, leak of the energy of a bulk wave is hard to occur, and further it is possible to reduce insertion loss, so that it is possible to make the band width ratio have a sufficient magnitude.

Figure 5:
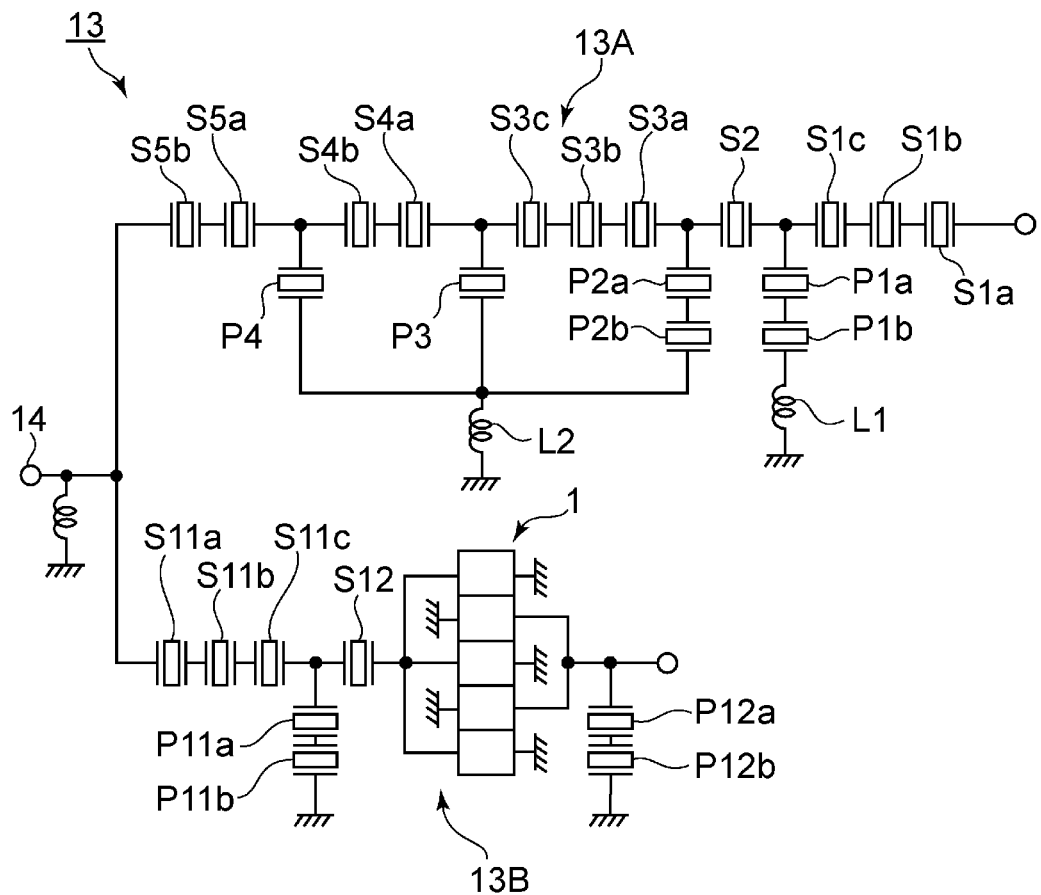
FIG. 5 is a circuit diagram of a duplexer used in the surface acoustic wave filter according to the first preferred embodiment of the present invention.

FIG. 5 is a circuit diagram of a duplexer including the surface acoustic wave filter according to the first preferred embodiment.

In the duplexer 13, a transmission filter 13A includes a ladder filter. In the ladder filter, series arm resonators S1a to S1c, S2, S3a to S3c, S4a, S4b, S5a, and S5b are connected in series in this order from the transmission terminal side. Parallel arm resonators P1a and P1b and an inductor L1 are connected between a ground potential and a connection point between the series arm resonator S1c and the series arm resonator S2. Parallel arm resonators P2a and P2b are connected between the ground potential and a connection point between the series arm resonator S2 and the series arm resonator S3a. A parallel arm resonator P3 is connected between the ground potential and a connection point between the series arm resonator S3c and the series arm resonator S4a. A parallel arm resonator P4 is connected between the ground potential and a connection point between the series arm resonator S4b and the series arm resonator S5a. Furthermore, an inductor L2 is connected between the ground potential and each of ground potential side end portions of the parallel arm resonators P2b, P3, and P4.

A reception filter 13B includes the longitudinally coupled resonator type surface acoustic wave filter 1 according to the present preferred embodiment. Series arm resonators S11a to S11c and a series arm resonator S12 are connected in series with each other between the surface acoustic wave filter 1 and an antenna terminal 14. In addition, a parallel arm resonator P11a and a parallel arm resonator P11b are connected between the ground potential and a connection point between the series arm resonator S11c and the series arm resonator S12.

In addition, parallel arm resonators P12a and P12b are connected between an output end of the surface acoustic wave filter 1 and the ground potential.

The following shows an example of a surface acoustic wave filter according to the first preferred embodiment.

As the example, the surface acoustic wave filter according to the above preferred embodiment was produced. The design parameters are as follows, for example.

A reception filter of Band 25; a pass band of 1930 MHz to 1995 MHz, and the design parameters are as follows. That is, in the reception filter 13B of the duplexer 13 shown in FIG. 5, a five-IDT longitudinally coupled resonator type surface acoustic wave filter was used as the surface acoustic wave filter 1. The overlap widths of the electrode fingers were 50 µm. The wavelengths determined by the electrode finger pitches in first to fifth interdigital transducers arranged in the propagation direction of the elastic wave are as shown in Table 1 below.

TABLE 1

|  | Wavelength (µm) |
| --- | --- |
| Reflector | 1.9739 |
| First and fifth IDTs | 1.9494 |
| Second and fourth IDTs | 1.9279 |
| Third IDT | 1.9834 |

In addition, each of the duties of the first to fifth interdigital transducers and the reflectors was set to about 0.5.

An IDT-IDT interval is an inter-electrode finger center distance, and each of the interval between the first and second interdigital transducer and the interval between the fourth and fifth interdigital transducers was set to about 0.33λ, for example. Each of the interval between the second and third interdigital transducers and the interval between the third and fourth interdigital transducers was set to about 0.30λ, for example. λ is the wavelength of each reflector.

The number of pairs of electrode fingers in each of the first and fifth interdigital transducers was set to 20 pairs, the number of pairs of electrode fingers in each of the second and fourth interdigital transducers was set to 18 pairs, and the number of pairs of electrode fingers in the third interdigital transducer was set to 25 pairs.

The number of electrode fingers of each reflector was set to 75.

In addition, the design parameters of the series arm resonators S11a to S11c, and S12 and the parallel arm resonators P11a, P11b, P12a, and P12b shown in FIG. 5 are as shown in Table 2 below.

TABLE 2

|  | S11a to S11c | P11a, P11b | S12 | P12a, P12b |
| --- | --- | --- | --- | --- |
| IDT wavelength (µm) | 1.9229 | 1.9839 | 1.9209 | 1.9814 |
| Reflector wavelength (µm) | Same as IDT | Same as IDT | Same as IDT | Same as IDT |
| Overlap width (µm) | 30 | 56.3 | 30 | 38 |
| Number of pairs of IDTs | 125 | 70 | 227 | 70 |
| Number of electrode fingers of reflector | 31 | 31 | 31 | 31 |
| Duty | 0.5 | 0.5 | 0.5 | 0.5 |

In addition, as a comparative example, a surface acoustic wave filter was produced in the substantially same manner as in the above example except for having narrow pitch portions. The wavelengths determined by the electrode finger pitches of the first to fifth interdigital transducers and the number of pairs of electrode fingers in the comparative example are as shown in Tables 3 and 4 below.

TABLE 3

|  | Wavelength (µm) |
| --- | --- |
| Reflector | 1.9849 |
| First and fifth IDT main | 1.9854 |
| First and fifth IDT narrow pitch portions | 1.8559 |
| Second and fourth IDT narrow pitch portions (outer) | 1.7809 |
| Second and fourth IDT main | 1.9399 |
| Second and fourth IDT narrow pitch portions (inner) | 1.8719 |
| Third IDT narrow pitch portion | 1.8989 |
| Third IDT main | 1.9744 |

TABLE 4

|  | Number of pairs of electrode fingers |
| --- | --- |
| First and fifth IDT main | 19 |
| First and fifth IDT narrow pitch portions | 1.5 |
| Second and fourth IDT narrow pitch portions (outer) | 1 |

TABLE 4-continued

|  | Number of pairs of electrode fingers |
|---|---|
| Second and fourth IDT main | 14.5 |
| Second and fourth IDT narrow pitch portions (inner) | 3.5 |
| Third IDT narrow pitch portion | 4.5 |
| Third IDT main | 22 |

Figure 6:
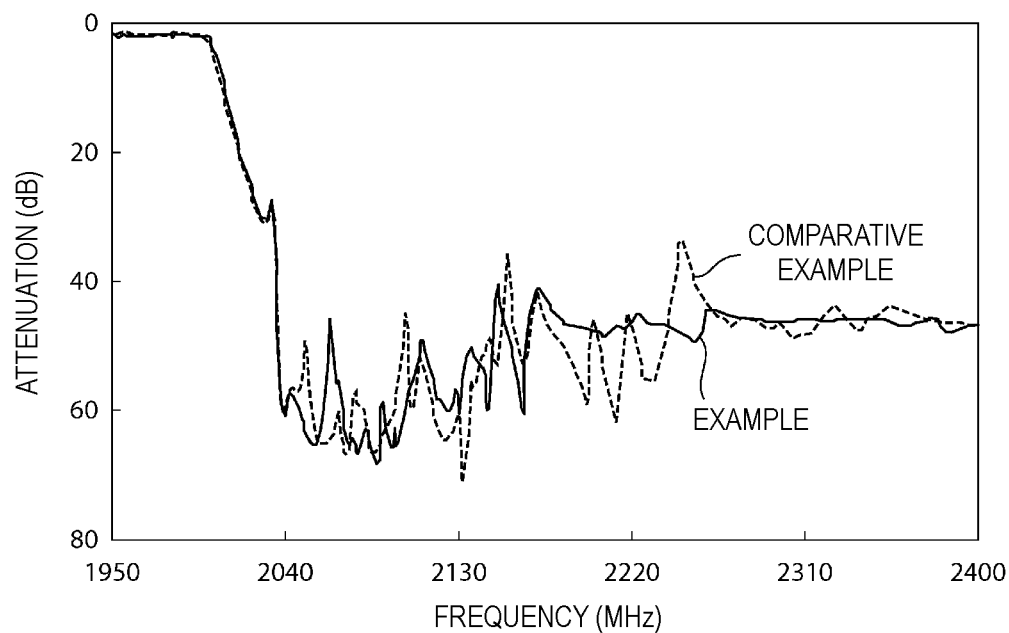
FIG. 6 is a diagram showing attenuation-frequency characteristics at a pass band high-frequency side of each of a surface acoustic wave filter according to an example of a preferred embodiment of the present invention and a surface acoustic wave filter according to a comparative example.

FIG. 6 shows attenuation-frequency characteristics at a pass band high-frequency side of each of the surface acoustic wave filter according to the above example and the surface acoustic wave filter according to the above comparative example. The solid line indicates the characteristics of the example, and the broken line indicates the characteristics of the comparative example.

In the present preferred embodiment, it appears that spurious in a frequency region at approximately 1.1 times of the pass band, that is, at approximately a frequency of 2195 MHz, is reduced as compared to the comparative example.

Therefore, it is possible to suitably use a surface acoustic wave filter according to a preferred embodiment of the present invention as a filter to define a duplexer.

In addition, in order to ensure a required pass band width in the reception filter, it is necessary to set the IDT-IDT distance shown in FIG. 3 in the surface acoustic wave filter to an appropriate value.

The inventor of the present application produced a plurality of surface acoustic wave filters in the same manner as in the above example, with the different inter-electrode finger center distances A.

Figure 7:
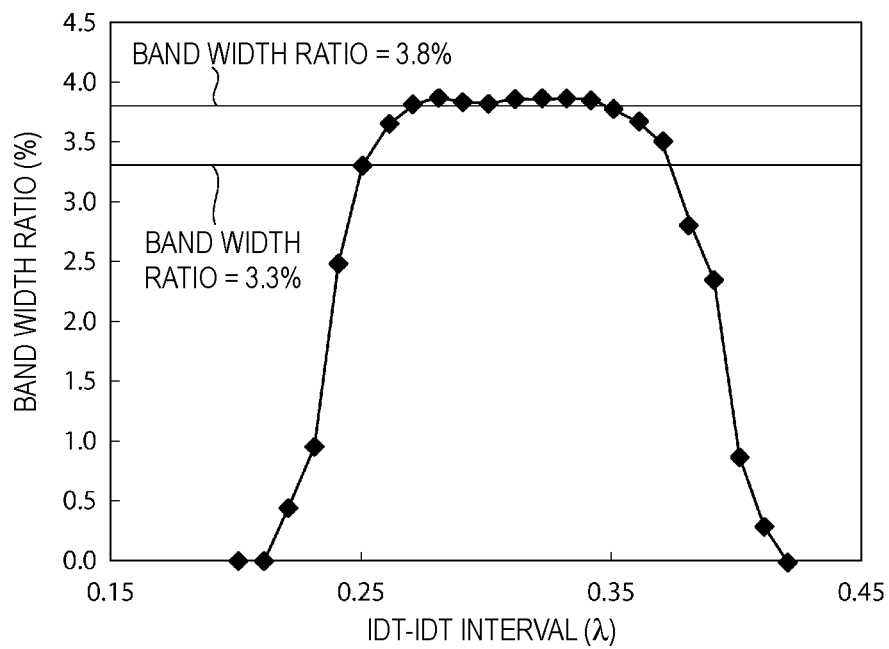
FIG. 7 is a diagram showing a relationship between an IDT-IDT interval and a band width ratio of the surface acoustic wave filter according to the first preferred embodiment of the present invention.

FIG. 7 is a diagram showing a relationship between the IDT-IDT interval and the band width ratio of the surface acoustic wave filter according to the first preferred embodiment of the present invention. The band width ratio is a value (%) obtained by dividing the pass band width by the center frequency.

In general, a band width ratio required for a cellular phone is about 3.3%. Thus, from FIG. 7, the inter-electrode finger center distance A preferably is not shorter than about $0.25\lambda$ and not longer than about $0.37\lambda$, for example.

The inter-electrode finger center distance A is further preferably not shorter than about $0.27\lambda$ and not longer than about $0.34\lambda$, for example. Thus, it is possible to ensure a band width ratio of about 3.8%, for example.

Figure 8:
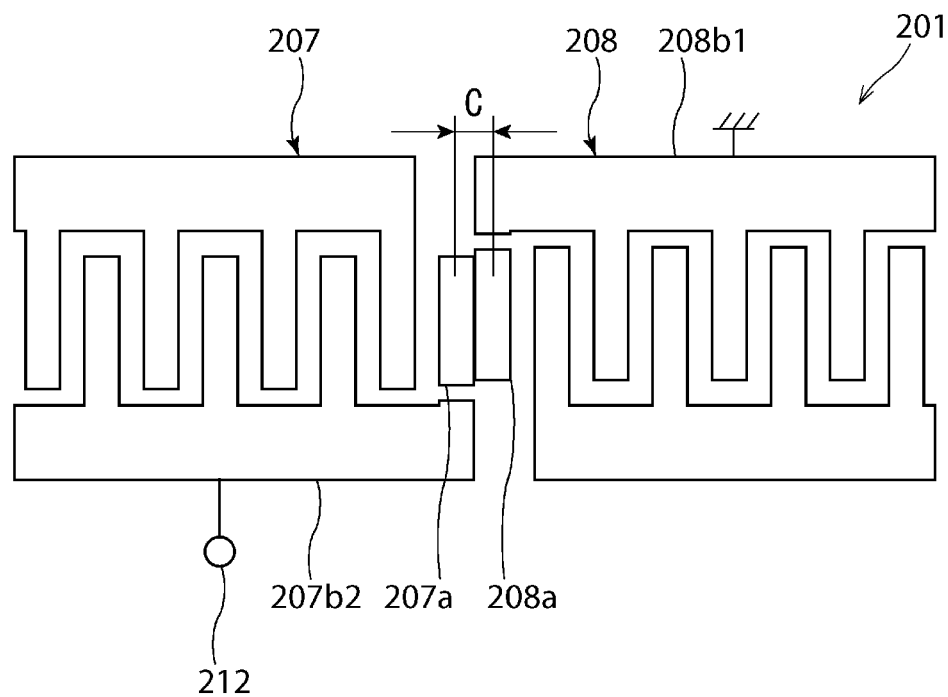
FIG. 8 is a schematic plan view showing a portion at which interdigital transducers are adjacent to each other in a surface acoustic wave filter according to a second preferred embodiment of the present invention.

FIG. 8 is a schematic plan view showing a portion at which interdigital transducers are adjacent to each other in a surface acoustic wave filter according to a second preferred embodiment of the present invention.

In the surface acoustic wave filter 201, a busbar 207b2 is electrically connected to a hot-side terminal 212. A busbar 208b1 is connected to a ground potential. An inter-electrode finger center distance C is about $0.25\lambda$, for example. Thus, an electrode finger 207a and an electrode finger 208a which are adjacent to each other are in contact with each other. In addition, the electrode fingers 207a and 208a are disconnected so as not to be connected to the busbars 207b2 and 208b1. The other structure is the same as in the first preferred embodiment. Since the electrode finger 207a and the electrode finger 208a are disconnected, it is possible to avoid a short circuit between the busbar 207b2 and the busbar 208b1.

Only either one of the electrode finger 207a and the electrode finger 208a which are in contact with each other may be disconnected.

Figure 9:
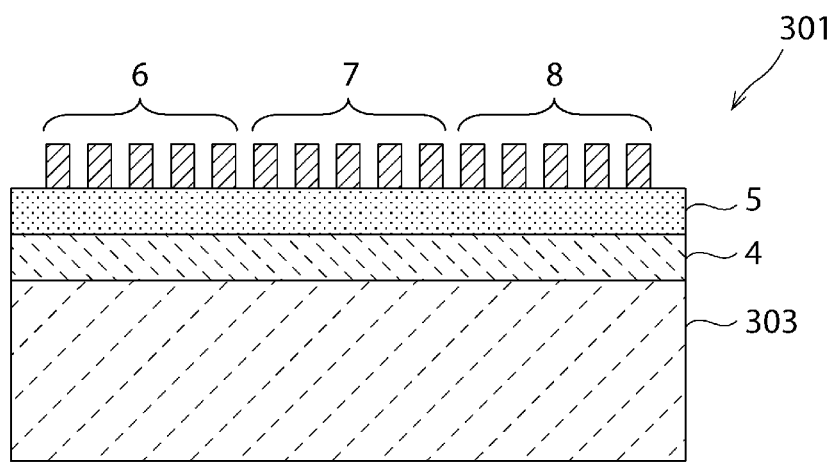
FIG. 9 is a front cross-sectional view of a surface acoustic wave filter according to a third preferred embodiment of the present invention.

FIG. 9 is a front cross-sectional view of a surface acoustic wave filter according to a third preferred embodiment of the present invention.

The surface acoustic wave filter 301 does not have a support substrate 2. In addition, a high-acoustic-velocity substrate 303 is used as a high-acoustic-velocity member. The high-acoustic-velocity substrate 303 is formed from an appropriate high-acoustic-velocity ceramic material. The other structure is the same as in the first preferred embodiment. In the present preferred embodiment as well, the same advantageous effects as those in the first preferred embodiment are obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator type surface acoustic wave filter comprising: a high-acoustic-velocity member; a low-acoustic-velocity film provided on the high-acoustic-velocity member; a piezoelectric film provided on the low-acoustic-velocity film; a plurality of interdigital transducers provided on the piezoelectric film and along a propagation direction of a surface acoustic wave and each including a plurality of electrode fingers; and reflectors arranged such that the interdigital transducers are interposed therebetween from both sides in the propagation direction of the surface acoustic wave; wherein a propagation velocity of a bulk wave in the high-acoustic-velocity member is higher than a propagation velocity of the bulk wave in the piezoelectric film; a propagation velocity of the bulk wave in the low-acoustic-velocity film is lower than the propagation velocity of the bulk wave in the piezoelectric film; an electrode finger pitch is uniform or substantially uniform in each of the interdigital transducers; and a wavelength determined by the electrode finger pitch in the reflector is defined as $\lambda$, and an inter-electrode finger center distance that is an interval between each of the interdigital transducers and the interdigital transducer adjacent thereto is not shorter than about $0.25\lambda$ and not longer than about $0.37\lambda$; a thickness of the high-acoustic velocity member is greater than a thickness of the low-acoustic velocity film; an electrode finger at an end of one of the plurality of interdigital transducers is in contact with an electrode at an end of another one of the plurality of interdigital transducers that is adjacent to the one of the plurality of interdigital transducers; the electrode finger at the end of one of the plurality of interdigital transducers is offset from the electrode finger at an end of one of the another one of the plurality of interdigital transducers; and each of the electrode finger at the end of the one of the plurality of interdigital transducers and the electrode finger at the end of the another one of the plurality of interdigital transducers is not connected to a busbar.

2. The surface acoustic wave filter according to claim 1, wherein the high-acoustic-velocity member includes a high-acoustic-velocity film, and a support substrate is provided on a surface of the high-acoustic-velocity film that is opposite to a surface of the high-acoustic-velocity film on which the low-acoustic-velocity film is provided.

3. The surface acoustic wave filter according to claim 1, wherein the high-acoustic-velocity member includes a high-acoustic-velocity substrate.

4. The surface acoustic wave filter according to claim 2, wherein the support substrate is formed from Si and has a thickness of about 200 μm.

5. The surface acoustic wave filter according to claim 1, wherein the high-acoustic-velocity member includes an aluminum nitride film, and the thickness of the high-acoustic-velocity member is about 1345 nm.

6. The surface acoustic wave filter according to claim 1, wherein the low-acoustic-velocity film includes a silicon oxide film, and the thickness of the low-acoustic-velocity film is about 670 nm.

7. The surface acoustic wave filter according to claim 1, wherein the piezoelectric film is made of $LiTaO_3$ having a cut angle of about 55° and has a thickness of about 600 nm.

8. The surface acoustic wave filter according to claim 1, wherein a number of the plurality of interdigital transducers is three.

9. The surface acoustic wave filter according to claim 1, wherein each of the plurality of interdigital transducers includes a multilayer metallic film.

10. The surface acoustic wave filter according to claim 1, wherein each of the plurality of interdigital transducers includes only one metallic film.

11. The surface acoustic wave filter according to claim 1, further comprising a protective film provided on the plurality of interdigital transducers.

12. The surface acoustic wave filter according to claim 11, wherein the protective film is made of silicon oxide and has a thickness of about 25 nm.

13. The surface acoustic wave filter according to claim 1, wherein the inter-electrode finger center distance is not shorter than about $0.27\lambda$ and not longer than about $0.34\lambda$.

14. The surface acoustic wave filter according to claim 1, wherein some of the electrode fingers are not connected to busbars of the plurality of interdigital transducers.

15. A duplexer comprising the surface acoustic wave filter according to claim 1.

16. The duplexer according to claim 15, further comprising a transmission filter including a ladder filter and a reception filter including the surface acoustic wave filter.

17. The duplexer according to claim 16, wherein the ladder filter includes a plurality of series arm resonators, a plurality of parallel arm resonators, and an inductor.

18. The duplexer according to claim 16, wherein the reception filter includes a plurality of series arm resonators and a plurality of parallel arm resonators.

* * * * *